United States Patent

Lai

(10) Patent No.: US 9,257,190 B2
(45) Date of Patent: Feb. 9, 2016

(54) LEVEL SHIFTER

(71) Applicant: eMemory Technology Inc., Hsin-Chu (TW)

(72) Inventor: Tzu-Neng Lai, Nantou County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 1 day.

(21) Appl. No.: 14/307,879

(22) Filed: Jun. 18, 2014

(65) Prior Publication Data

US 2015/0288365 A1 Oct. 8, 2015

Related U.S. Application Data

(60) Provisional application No. 61/973,852, filed on Apr. 2, 2014.

(51) Int. Cl.

| | |
|---|---|
| *G11C 16/14* | (2006.01) |
| *H02M 1/14* | (2006.01) |
| *H02M 3/07* | (2006.01) |
| *H03K 19/0185* | (2006.01) |

(52) U.S. Cl.
CPC ............... *G11C 16/14* (2013.01); *H02M 1/14* (2013.01); *H02M 3/07* (2013.01); *H03K 19/018514* (2013.01)

(58) Field of Classification Search
CPC ..... H03K 17/00; H03K 17/102; H03K 19/00; H03K 19/00315; H03K 19/018514; H03K 19/018521; H03K 3/00; H03K 3/012; H03K 3/356113

USPC .......................................................... 327/333
See application file for complete search history.

(56) References Cited

U.S. PATENT DOCUMENTS

| | | | |
|---|---|---|---|
| 2005/0162209 A1* | 7/2005 | Dubey et al. .................. 327/333 |
| 2006/0061386 A1* | 3/2006 | Kanzaki ........................ 326/81 |
| 2007/0164789 A1* | 7/2007 | Panjwani et al. .............. 326/80 |
| 2013/0181762 A1 | 7/2013 | Wu et al. |

FOREIGN PATENT DOCUMENTS

EP 1083659 B1 3/2001

* cited by examiner

*Primary Examiner* — John Poos
*Assistant Examiner* — David Mattison
(74) *Attorney, Agent, or Firm* — WPAT, PC; Justin King

(57) ABSTRACT

A level shifter includes a differential input pair circuit, a current mirror circuit, a switching circuit, a first keeper circuit, a second keeper circuit, and an output buffering circuit. The differential input pair circuit is connected with a first node, a second node and a first voltage. The differential input pair circuit receives an input signal and an inverted input signal. The current mirror circuit is connected with a third voltage, and includes a first current output terminal connected with a third node and a second current output terminal generating an output signal. The switching circuit includes a first control terminal receiving the inverted output signal. The second keeper circuit is connected between the third voltage and the second node, and includes a third control terminal receiving the inverted input signal and a fourth control terminal receiving the inverted output signal.

9 Claims, 5 Drawing Sheets

LEVEL SHIFTER

This application claims the benefit of U.S. provisional patent application No. 61/973,852, filed Apr. 2, 2014, the subject matter of which is incorporated herein by reference.

FIELD OF THE INVENTION

The present invention relates to a level shifter, and more particularly to a level shifter with a current mirror circuit.

BACKGROUND OF THE INVENTION

A level shifter is used for converting a narrow-range input signal into a wide-range output signal.

FIG. 1 is a schematic circuit diagram illustrating a conventional level shifter. In the conventional level shifter 100, an input signal Sin is changed between a first high logic level and a low logic level, and an output signal Sout is changed between a second high logic level and the low logic level. For example, the low logic level is equal to a first voltage Vss, the first high logic level is equal to a second voltage Vdd, and the second high logic level is equal to a third voltage Vpp.

As shown in FIG. 1, the conventional level shifter 100 comprises a first inverter 110, an output buffering unit 120, and plural transistors Mp1, Mp2, Mn1 and Mn2. The output buffering unit 120 comprises a second inverter 122 and a third inverter 123.

The first inverter 110 is operated in a voltage range between the second voltage Vdd and the first voltage Vss for converting the input signal Sin into an inverted input signal Sinb. Moreover, the second inverter 122 and the third inverter 123 are operated in a voltage range between the third voltage Vpp and the first voltage Vss. Moreover, the third voltage Vpp is larger than the second voltage Vdd, and the second voltage Vdd is larger than the first voltage Vss.

The source terminal of the transistor Mp1 receives the third voltage Vpp. The drain terminal of the transistor Mp1 is connected with a node a1. The gate terminal of the transistor Mp1 is connected with a node a2. The source terminal of the transistor Mp2 receives the third voltage Vpp. The drain terminal of the transistor Mp2 is connected with the node a2. The gate terminal of the transistor Mp2 is connected with the node a1. The source terminal of the transistor Mn1 receives the first voltage Vss. The drain terminal of the transistor Mn1 is connected with the node a1. The gate terminal of the transistor Mn1 receives the input signal Sin. The source terminal of the transistor Mn2 receives the first voltage Vss. The drain terminal of the transistor Mn2 is connected with the node a2. The gate terminal of the transistor Mn2 receives the inverted input signal Sinb.

The second inverter 122 and the third inverter 123 of the output buffering unit 120 are connected with each other in series. The input terminal of the second inverter 122 is connected with the node a2. The output terminal of the third inverter 123 generates the output signal Sout.

In case that the input signal Sin has the low logic level (i.e. the first voltage Vss), the inverted input signal Sinb has the first high logic level (i.e. the second voltage Vdd). Under this circumstance, the transistor Mn2 is turned on, the transistor Mn1 is turned off, the transistor Mp1 is turned on, and the transistor Mp2 is turned off. The voltage at the node a1 is equal to the third voltage Vpp, and the voltage at the node a2 is equal to the first voltage Vss. Consequently, the output signal Sout from the output buffering unit 120 has the low logic level (i.e. the first voltage Vss).

In case that the input signal Sin has the first high logic level (i.e. the second voltage Vdd), the inverted input signal Sinb has the low logic level (i.e. the first voltage Vss). Under this circumstance, the transistor Mn1 is turned on, the transistor Mn2 is turned off, the transistor Mp2 is turned on, and the transistor Mp1 is turned off. The voltage at the node a1 is equal to the first voltage Vss, and the voltage at the node a2 is equal to the third voltage Vpp. Consequently, the output signal Sout from the output buffering unit 120 has the second high logic level (i.e. the third voltage Vpp).

However, the conventional level shifter 100 may suffer from N-P MOS fighting which results from the plural transistors Mp1, Mp2, Mn1 and Mn2 when the logic state of the input signal is changed, the gate delay of the conventional level shifter 100 is long. That is, after the input signal Sin is switched from the low logic level to the first high logic level, a longer time period is required to switch the output signal Sout from the low logic level to the second high logic level. Similarly, after the input signal Sin is switched from the first high logic level to the low logic level, a longer time period is required to switch the output signal Sout from the second high logic level to the low logic level. Thus, a level shifter with shorter gate delay is needed.

SUMMARY OF THE INVENTION

An embodiment of the present invention provides a level shifter. The level shifter includes a differential input pair circuit, a current mirror circuit, a switching circuit, a first keeper circuit, a second keeper circuit, and an output buffering circuit. The differential input pair circuit is connected with a first node, a second node and a first voltage. The differential input pair circuit has a first signal input terminal receiving an input signal and a second input terminal receiving an inverted input signal. Each of the input signal and the inverted input signal is changed between a first high logic level and a low logic level. The low logic level is equal to the first voltage. The first high logic level is equal to a second voltage. The current mirror circuit is connected with a third voltage. The current mirror circuit has a first current output terminal connected with a third node and a second current output terminal connected with the second node. A voltage signal at the second node is an output signal. The switching circuit is connected between the first node and the third node, and includes a first control terminal. The first keeper circuit is connected between the third voltage and the third node, and includes a second control terminal. The second control terminal is connected with the first signal input terminal. The second keeper circuit is connected between the third voltage and the second node, and includes a third control terminal and a fourth control terminal. The third control terminal is connected with the second signal input terminal. The output buffering circuit is connected with the second node for receiving the output signal and generating an inverted output signal. Each of the output signal and the inverted output signal is changed between a second high logic level and the low logic level. The second high logic level is equal to the third voltage. If the input signal has the low logic level, the first keeper circuit is active, the second keeper circuit is inactive, the switching circuit is in a close state, and the output signal has the low logic level. If the input signal has the first high logic level, the first keeper circuit is inactive, the second keeper circuit is active, the switching circuit is in an open state, and the output signal has the second high logic level.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
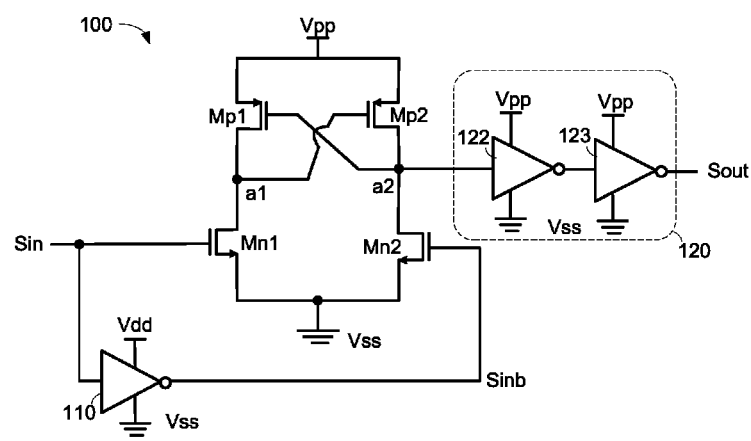
FIG. 1 (prior art) is a schematic circuit diagram illustrating a conventional level shifter.
Figure 2:
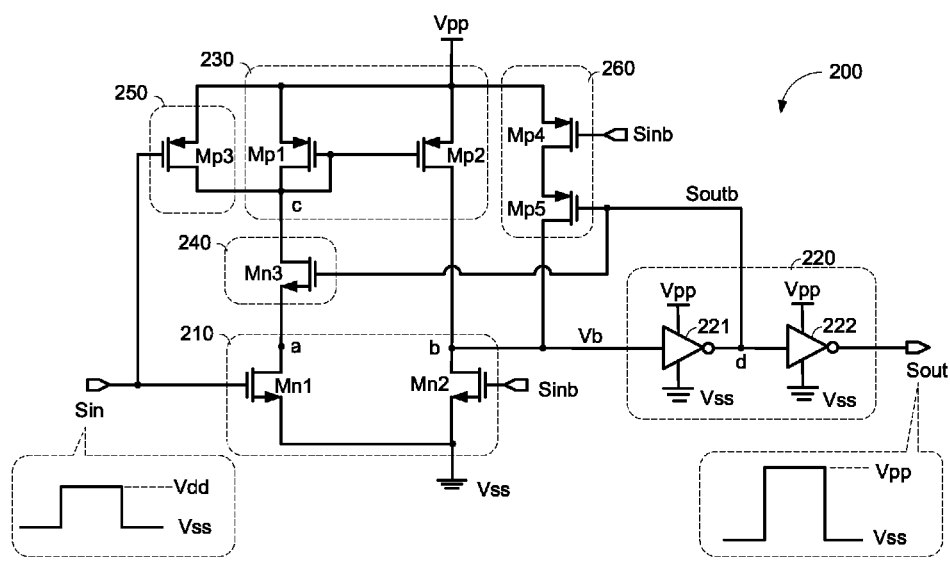
FIG. 2 is a schematic circuit diagram illustrating a level shifter according to an embodiment of the present invention.

FIG. 2 is a schematic circuit diagram illustrating a level shifter according to an embodiment of the present invention.

In the level shifter 200, each of an input signal Sin and an inverted input signal Sinb is changed between a first high logic level and a low logic level, and each of an output signal Sout and an inverted output signal Soutb is changed between a second high logic level and the low logic level. In this embodiment, the low logic level is equal to a first voltage Vss, the first high logic level is equal to a second voltage Vdd, and the second high logic level is equal to a third voltage Vpp. Moreover, the third voltage Vpp is larger than the second voltage Vdd, and the second voltage Vdd is larger than the first voltage Vss.

As shown in FIG. 2, the level shifter 200 comprises a current mirror circuit 230, a differential input pair circuit 210, an output buffering circuit 220, a first keeper circuit 250, a second keeper circuit 260, and a switching circuit 240.

The differential input pair circuit 210 comprises two transistors Mn1 and Mn2. The drain terminal of the transistor Mn1 is connected with a node a. The source terminal of the transistor Mn1 receives the first voltage Vss. The gate terminal of the transistor Mn1 receives the input signal Sin. The source terminal of the transistor Mn2 receives the first voltage Vss. The gate terminal of the transistor Mn2 receives the inverted input signal Sinb. The drain terminal of the transistor Mn2 is connected with a node b.

The current mirror circuit 230 comprises two transistors Mp1 and Mp2. The source terminal of the transistor Mp1 receives the third voltage Vpp. The gate terminal and the drain terminal of the transistor Mp1 are connected to a node c. The source terminal of the transistor Mp2 receives the third voltage Vpp. The gate terminal of the transistor Mp2 is connected with the node c. The drain terminal of the transistor Mp2 is connected with the node b.

The switching circuit 240 comprises a transistor Mn3. The drain terminal of the transistor Mn3 is connected with the node c. The source terminal of the transistor Mn3 is connected with the node a. The gate terminal of the transistor Mn3 receives the inverted output signal Soutb. The gate terminal of the transistor Mn3 is a control terminal of the switching circuit 240. According to the inverted output signal Soutb, the switching circuit 240 is selectively in a close state or an open state. In this embodiment, the switching circuit 240 is implemented by the N-type transistor Mn3. Alternatively, in some other embodiments, the switching circuit 240 may be implemented by a P-type transistor (not shown).

The first keeper circuit 250 comprises a transistor Mp3. The source terminal of the transistor Mp3 receives the third voltage Vpp. The drain terminal of the transistor Mp3 is connected with the node c. The gate terminal of the transistor Mp3 receives the input signal Sin. In case that the input signal Sin has the low logic level, the first keeper circuit 250 is active. In case that the input signal Sin has the first high logic level, the first keeper circuit 250 is inactive.

The second keeper circuit 260 comprises two transistors Mp4 and Mp5. The source terminal of the transistor Mp4 receives the third voltage Vpp. The gate terminal of the transistor Mp4 receives the inverted input signal Sinb. The source terminal of the transistor Mp5 is connected with the drain terminal of the transistor Mp4. The drain terminal of the transistor Mp5 is connected with the node b. The gate terminal of the transistor Mp5 receives the inverted output signal Soutb. It is noted that the signals received by the gate terminals of the transistors Mp4 and Mp5 may be exchanged. That is, in some other embodiments, the gate terminal of the transistor Mp4 receives the inverted output signal Soutb, and the gate terminal of the transistor Mp5 receives the inverted input signal Sinb. Moreover, in case that both of the inverted input signal Sinb and the inverted output signal Soutb have the low logic level, the second keeper circuit 260 is active. In other situations, the second keeper circuit 260 is inactive.

The output buffering unit 220 comprises two inverters 221 and 222. These inverters 221 and 222 are connected with each other in series. The input terminal of the inverter 221 is connected with the node b. The output terminal of the inverter 221 generates the inverted output signal Soutb. The input terminal of the inverter 222 receives the inverted output signal Soutb. The output terminal of the inverter 222 generates the output signal Sout. Since the voltage signal Vb at the node b is very similar to the output signal Sout, if the driving strength of the level shifter 200 is not taken into consideration, the voltage signal Vb at the node b may be considered as the output signal Sout. Under this circumstance, the output buffering unit 220 may only comprise the inverter 221 to generate the inverted output signal Soutb.

Figure 3A:
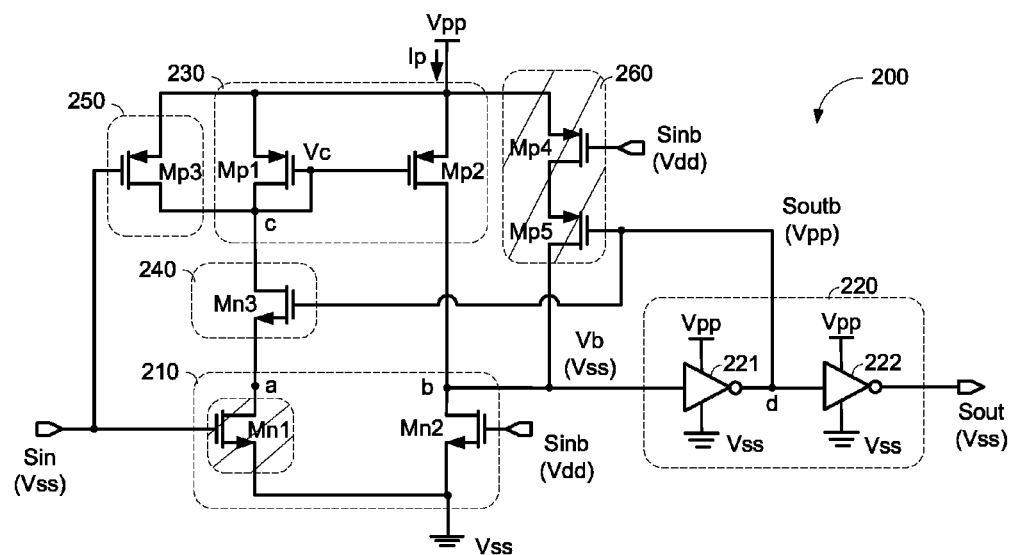
FIGS. 3A and 3B are schematic circuit diagrams illustrating the operations of the present level shifter in two steady state periods.
Figure 3B:
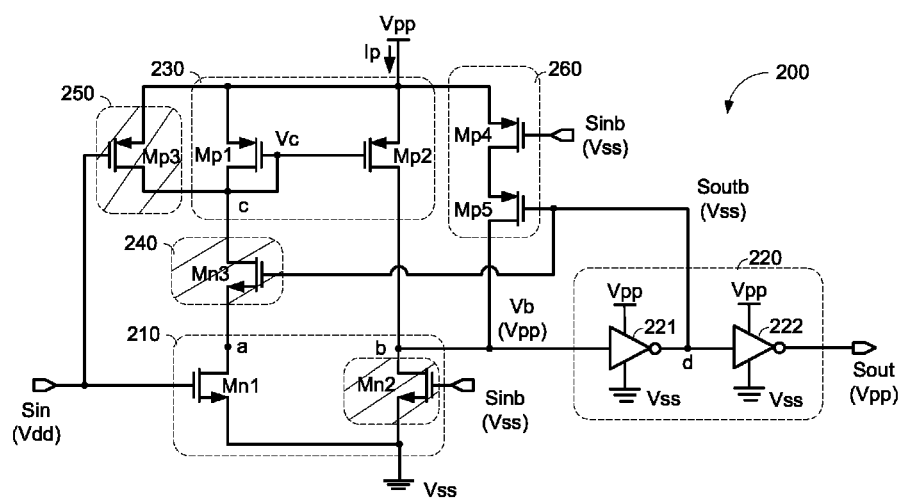

FIGS. 3A and 3B are schematic circuit diagrams illustrating the operations of the present level shifter in two steady state periods.

Please refer to FIG. 3A. In the first steady state period, the input signal Sin has the low logic level (i.e. the first voltage Vss), and the inverted input signal Sinb has the first high logic level (i.e. the second voltage Vdd). Under this circumstance, the transistor Mn2 is turned on, the transistor Mn1 is turned off, the first keeper circuit 250 is active, and the second keeper circuit 260 is inactive. Since the transistor Mn1 is turned off, the current mirror circuit 230 is inactive. Under this circumstance, the current mirror circuit 230 fails to generate a current. Since the transistor Mn2 is turned on, the voltage signal Vb at the node b and the output signal Sout both have the low logic level, and the inverted output signal Soutb has the second high logic level. Under this circumstance, the switching circuit 240 is in the close state.

Obviously, if the input signal Sin has the low logic level in the first steady state period, the output signal Sout has the low logic level. Moreover, since the current mirror circuit 230 is inactive, no leakage current is generated by the level shifter 200. That is, in the first steady state period, the current Ip of the level shifter 200 is zero. Consequently, the level shifter 200 has no power consumption.

In a first transient state period immediately after the input signal Sin is switched from the low logic level to the first high logic level, the first keeper circuit 250 is inactive, the transistor Mn1 is turned on, and the transistor Mn2 is turned off. Consequently, the current mirror circuit 230 is active. Meanwhile, the voltage signal Vb at the node b is increased to (Vpp−Vsdp2), wherein Vsdp2 is the source-drain voltage. Under this circumstance, the inverted output signal Soutb is decreased to the low logic level, and the switching circuit 240 is in the open state.

When the inverted output signal Soutb reaches the low logic level, the second keeper circuit 260 is active. In addition, the voltage signal Vb at the node b is pulled up to the third voltage Vpp. The second steady state period comes immediately after the first transient state period.

Please refer to FIG. 3B. In the second steady state period, the input signal Sin has the first high logic level, and the inverted input signal Sinb has the low logic level. Under this circumstance, the transistor Mn1 is turned on, the transistor Mn2 is turned off, the first keeper circuit 250 is inactive, the second keeper circuit 260 is active, and the switching circuit 240 is in the open state. Since the switching circuit 240 is in the open state, the current mirror circuit 230 is inactive. Under this circumstance, the current mirror circuit 230 fails to generate a current. Since the second keeper circuit 260 is active, the voltage signal Vb at the node b and the output signal Sout both have the second high logic level, and the inverted output signal Soutb has the low logic level.

Obviously, if the input signal Sin has the first logic level in the second steady state period, the output signal Sout has the second high logic level. Moreover, since the current mirror circuit 230 is inactive, no leakage current is generated by the level shifter 200. That is, in the second steady state period, the current Ip of the level shifter 200 is zero. Consequently, the level shifter 200 has no power consumption.

In a second transient state period immediately after the input signal Sin is switched from the first high logic level to the low logic level, the first keeper circuit 250 is active, the second keeper circuit 260 is inactive, the transistor Mn1 is turned off, and the transistor Mn2 is turned on. Meanwhile, the voltage signal Vb at the node b is decreased to the first voltage Vss, and the inverted output signal Soutb is increased to the second high logic level.

When the inverted output signal Soutb reaches the second high logic level, the switching circuit 240 is in the close state. The first steady state period comes immediately after the second transient state period.

From the above discussions, the level shifter of the present invention has the current mirror circuit. In accordance with the present invention, the first voltage Vss is equal to a ground voltage, the second voltage Vdd is in the range between 0.8V and 1.38V, and the third voltage Vpp is in the range between 1.53V and 6.4V. In other words, the level shifter of the present invention is capable of converting the narrow-range low input signal into the wide-range high output voltage.

Figure 4:
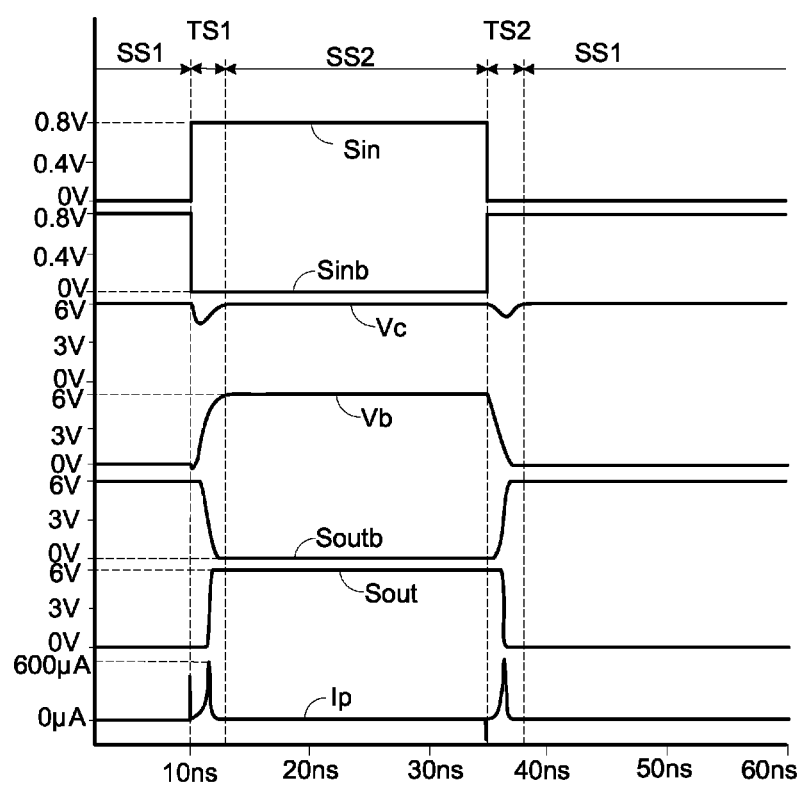
FIG. 4 is a schematic timing waveform diagram illustrating associated signals processed by the level shifter according to the embodiment of the present invention.

FIG. 4 is a schematic timing waveform diagram illustrating associated signals processed by the level shifter according to the embodiment of the present invention. As shown in FIG. 4, the second voltage Vdd is 0.8V, the first voltage Vss is 0V, and the third voltage Vpp is 6V. In the first steady state period SS1, the input signal Sin has the low logic level, the inverted input signal Sinb has the first high logic level, the voltage signal Vc at the node c is equal to the third voltage Vpp, the voltage signal Vb at the node b is equal to the first voltage Vss, the output signal Sout has the low logic level, and the inverted output signal Soutb has the second high logic level. That is, in the first steady state period, the current Ip of the level shifter 200 is zero. Consequently, the level shifter 200 has no power consumption.

In the first transient state period TS1 immediately after the input signal Sin is switched to the first high logic level and the inverted output signal Soutb is switched to the low logic level, the voltage signal Vc at the node c is changed. Consequently, the current mirror circuit 230 is active to generate the current Ip. Moreover, in the first transient state period TS1, the voltage signal Vb at the node b is increased to the third voltage Vpp, the output signal Sout is switched to the second high logic level, and the inverted output signal Soutb is switched to the low logic level. The second steady state period SS2 comes immediately after the first transient state period.

In the second steady state period SS2, the input signal Sin has the first high logic level, the inverted input signal Sinb has the low logic level, the voltage signal Vc at the node c is equal to the third voltage Vpp, the voltage signal Vb at the node b is equal to the third voltage Vpp, the output signal Sout has the second high logic level, and the inverted output signal Soutb has the low logic level. That is, in the second steady state period, the current Ip of the level shifter 200 is zero. Consequently, the level shifter 200 has no power consumption.

In the second transient state period TS2 immediately after the input signal Sin is switched to the low logic level and the inverted input signal Sinb is switched to the first high logic level, the voltage signal Vc at the node c is changed. Consequently, the current mirror circuit 230 is inactive to generate the current Ip. Moreover, in the second transient state period TS2, the voltage signal Vb at the node b is decreased to the first voltage Vss, the output signal Sout is switched to the low logic level, and the inverted output signal Soutb is switched to the second high logic level. The first steady state period comes immediately after the second transient state period. In response to the change of the input signal Sin, the associated signals are periodically switched between the four periods SS1, TS1, SS2 and TS2. According to the relationship between the input signal Sin and the output signal Sout, the gate delay of the level shifter of the present invention is shorter than 2 ns.

From the above descriptions, the present invention provides a level shifter with a current mirror circuit. The level shifter of the present invention is capable of converting the narrow-range low input signal into the wide-range high output voltage. Moreover, the level shifter of the present invention adopts a current mirror and keepers to improve the gate delay of the level shifter. As a result, the higher speed level shifter can be implemented by present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A level shifter, comprising:
   a differential input pair circuit connected with a first node, a second node and a first voltage, wherein the differential input pair circuit has a first signal input terminal receiving an input signal and a second signal input terminal receiving an inverted input signal, wherein each of the input signal and the inverted input signal is changed between a first high logic level and a low logic level, wherein the low logic level is equal to the first voltage, and the first high logic level is equal to a second voltage;
a current mirror circuit connected with a third voltage, wherein the current mirror circuit has a first current output terminal connected with a third node and a second current output terminal connected with the second node, wherein a voltage signal at the second node is an output signal;
a switching circuit connected between the first node and the third node, and comprising a first control terminal;
a first keeper circuit connected between the third voltage and the third node, and comprising a second control terminal, wherein the second control terminal is directly connected with the first signal input terminal for receiving the input signal;
an output buffering circuit comprising a buffer input terminal connected with the second node for receiving the output signal and generating an inverted output signal, wherein each of the output signal and the inverted output signal is changed between a second high logic level and the low logic level, wherein the second high logic level is equal to the third voltage; and
a second keeper circuit connected with the third voltage and directly connected with the buffer input terminal, and comprising a third control terminal and a fourth control terminal, wherein the third control terminal is connected with the second signal input terminal,
wherein if the input signal has the low logic level, the first keeper circuit is active such that the third node is kept at the third voltage, the second keeper circuit is inactive, the switching circuit is in a closed state, and the output signal has the low logic level, wherein if the input signal has the first high logic level, the first keeper circuit is inactive, the second keeper circuit is active, the switching circuit is in an open state, and the output signal has the second high logic level.

2. The level shifter as claimed in claim 1, wherein the third voltage is larger than the second voltage, and the second voltage is larger than the first voltage.

3. The level shifter as claimed in claim 1, wherein the differential input pair circuit comprises:
a first n-type transistor, wherein a drain terminal of the first n-type transistor is connected with the first node, a source terminal of the first n-type transistor receives the first voltage, and a gate terminal of the first n-type transistor is the first signal input terminal; and
a second n-type transistor, wherein a drain terminal of the second n-type transistor is connected with the second node, a source terminal of the second n-type transistor receives the first voltage, and a gate terminal of the second n-type transistor is the second signal input terminal.

4. The level shifter as claimed in claim 3, wherein the current mirror circuit comprises:
a first p-type transistor, wherein a gate terminal and a drain terminal of the first p-type transistor are connected with the third node, and a source terminal of the first p-type transistor receives the third voltage; and
a second p-type transistor, wherein a gate terminal of the second p-type transistor is connected with the third node, a drain terminal of the second p-type transistor is connected with the second node, and a source terminal of the second p-type transistor receives the third voltage.

5. The level shifter as claimed in claim 4, wherein the switching circuit comprises a third n-type transistor, wherein a drain terminal of the third n-type transistor is connected with the third node, a source terminal of the third n-type transistor is connected with the first node, and a gate terminal of the third n-type transistor is the first control terminal and receives the inverted output signal.

6. The level shifter as claimed in claim 5, wherein the first keeper circuit comprises a third p-type transistor, wherein a drain terminal of the third p-type transistor is connected with the third node, a source terminal of the third p-type transistor receives the third voltage, and a gate terminal of the third p-type transistor is the second control terminal directly connected with the first signal input terminal for receiving the input signal.

7. The level shifter as claimed in claim 6, wherein the second keeper circuit comprises:
a fourth p-type transistor, wherein a source terminal of the fourth p-type transistor receives the third voltage, and a gate terminal of the fourth p-type transistor is the third control terminal and receives the inverted input signal; and
a fifth p-type transistor, wherein a gate terminal of the fifth p-type transistor is the fourth control terminal and receives the inverted output signal, a drain terminal of the fifth p-type transistor is directly connected with the buffer input terminal of the output buffering circuit, and a source terminal of the fifth p-type transistor is connected with a drain terminal of the fourth p-type transistor.

8. The level shifter as claimed in claim 7, wherein the output buffering circuit comprises a first inverter, wherein an input terminal of the first inverter is the buffer input terminal connected with the second node, and an output terminal of the first inverter generates the inverted output signal.

9. The level shifter as claimed in claim 8, wherein the output buffering circuit further comprises a second inverter, wherein an input terminal of the second inverter is connected with the output terminal of the first inverter.

* * * * *